United States Patent
Tsyrganovich

[19]
[11] Patent Number: 6,166,606
[45] Date of Patent: Dec. 26, 2000

[54] PHASE AND FREQUENCY LOCKED CLOCK GENERATOR

[75] Inventor: Anatoliy V. Tsyrganovich, San Jose, Calif.

[73] Assignee: Zilog, Inc., Campbell, Calif.

[21] Appl. No.: 09/247,896

[22] Filed: Feb. 10, 1999

[51] Int. Cl.[7] ............................................. H03L 7/06
[52] U.S. Cl. ........................... 331/25; 331/1 A; 327/160
[58] Field of Search ........................... 331/2, 25; 337/11, 337/1 A, 16; 348/536, 537; 327/160

[56] References Cited

U.S. PATENT DOCUMENTS

| | | | |
|---|---|---|---|
| 4,305,045 | 12/1981 | Metz et al. | 331/1 A |
| 4,675,617 | 6/1987 | Martin | 331/1 A |
| 5,237,290 | 8/1993 | Banu et al. | 331/2 |
| 6,018,273 | 1/2000 | Tsyrganovich | 331/2 |
| 6,066,988 | 5/2000 | Igura | 331/18 |
| 6,072,370 | 6/2000 | Nakamura | 331/25 |

FOREIGN PATENT DOCUMENTS 2138564  12/1994  Canada .

*Primary Examiner*—Arnold Kinkead
*Attorney, Agent, or Firm*—Majestic, Parsons, Siebert & Hsue

[57] ABSTRACT

A phase locked loop is described for generating an output clock signal that is both synchronizing with a synchronizing signal and oscillating at substantially the same frequency as required by the system. The phase locked loop as disclosed compares the time durations of the output clock of a voltage-controlled oscillator with the system clock for N cycles. A correction signal is then generated by comparing these two time durations, and the correction signal is fed back to the voltage-controlled oscillator to eliminate the difference in the time durations. In addition, the voltage-controlled oscillator is also synchronized with the synchronizing signal by using the synchronizing signal as a reset.

17 Claims, 5 Drawing Sheets

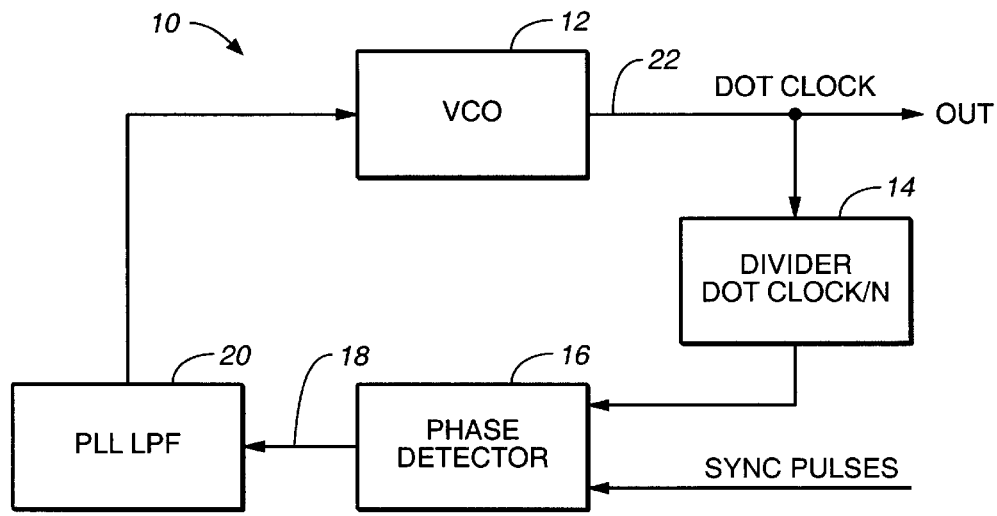
FIG._1
*(PRIOR ART)*
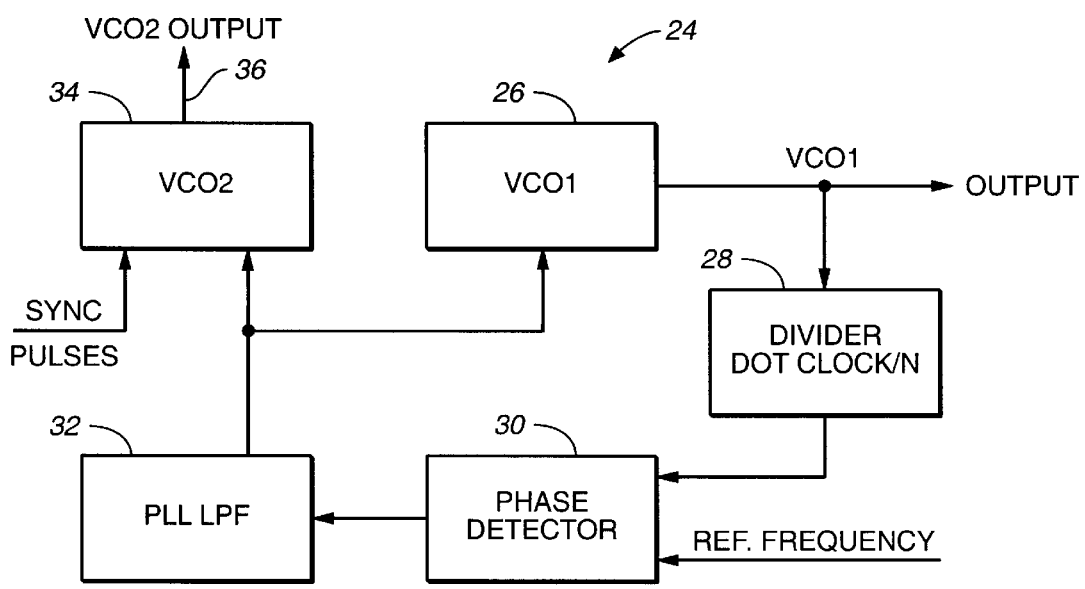
FIG._2
*(PRIOR ART)*

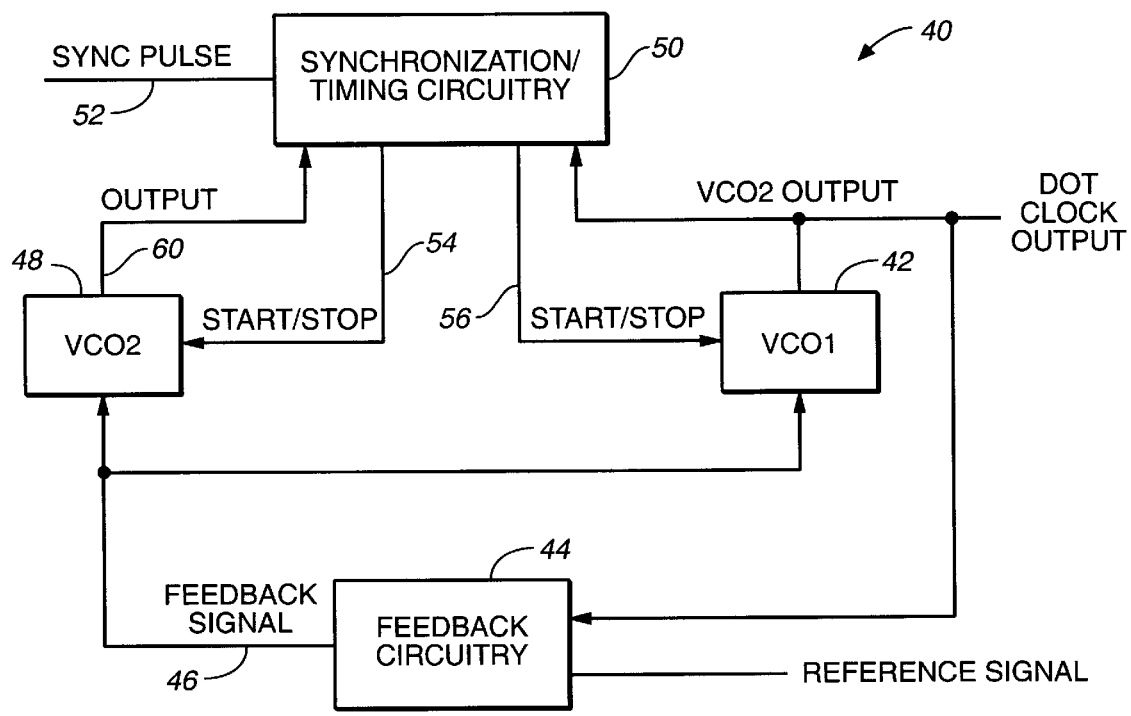
FIG._3
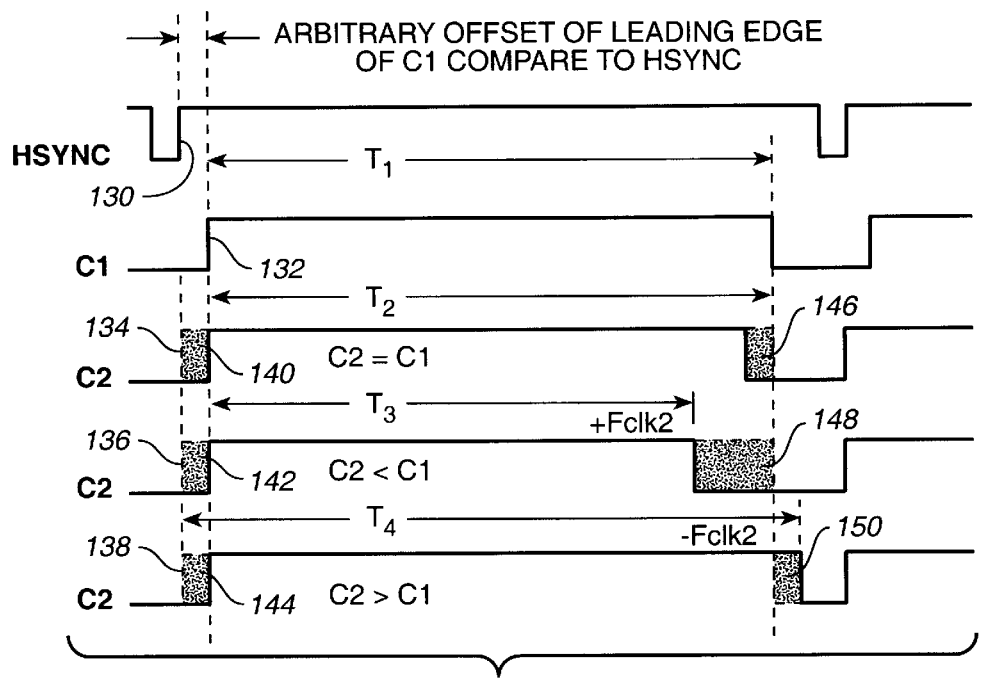
FIG._6

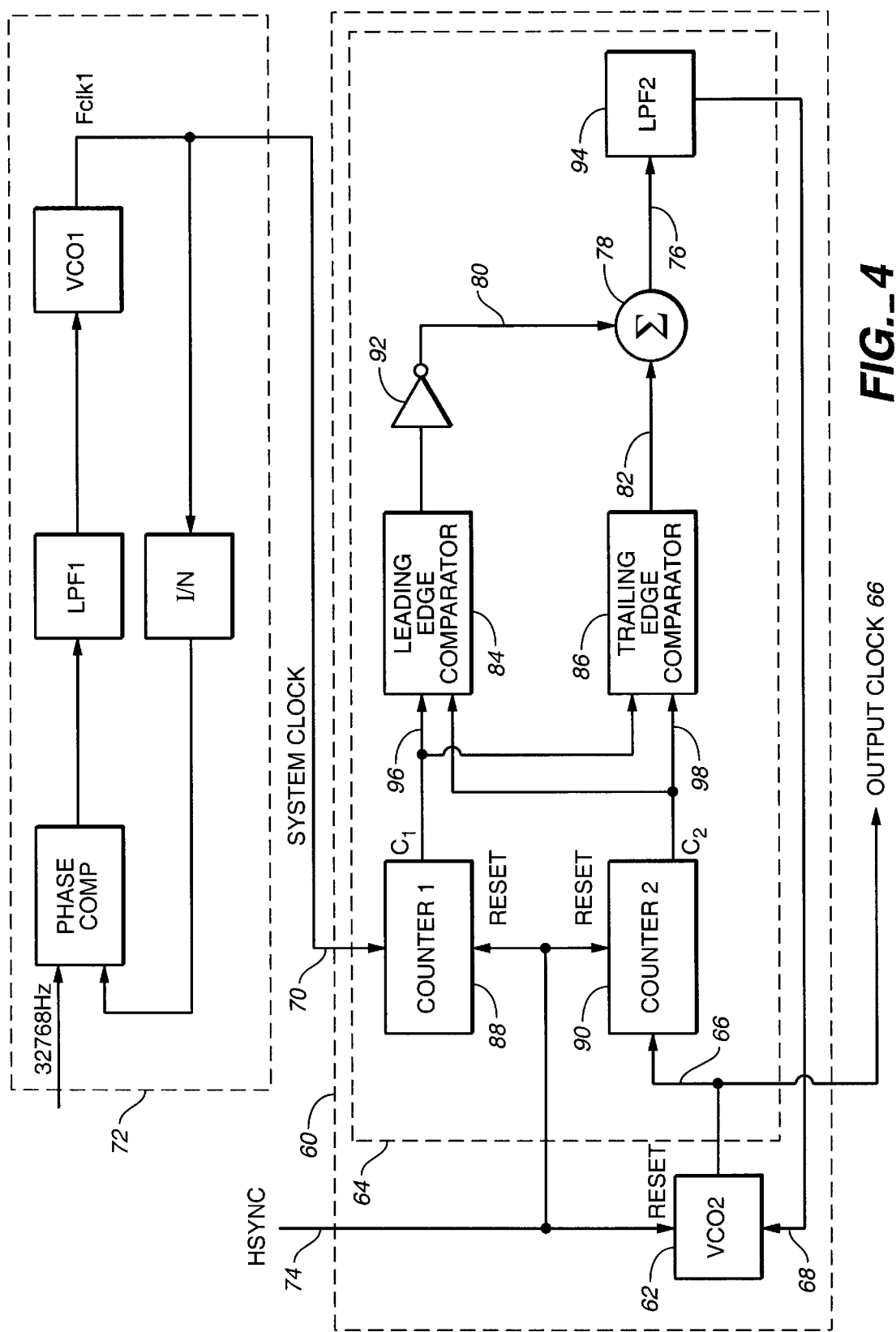
FIG._4

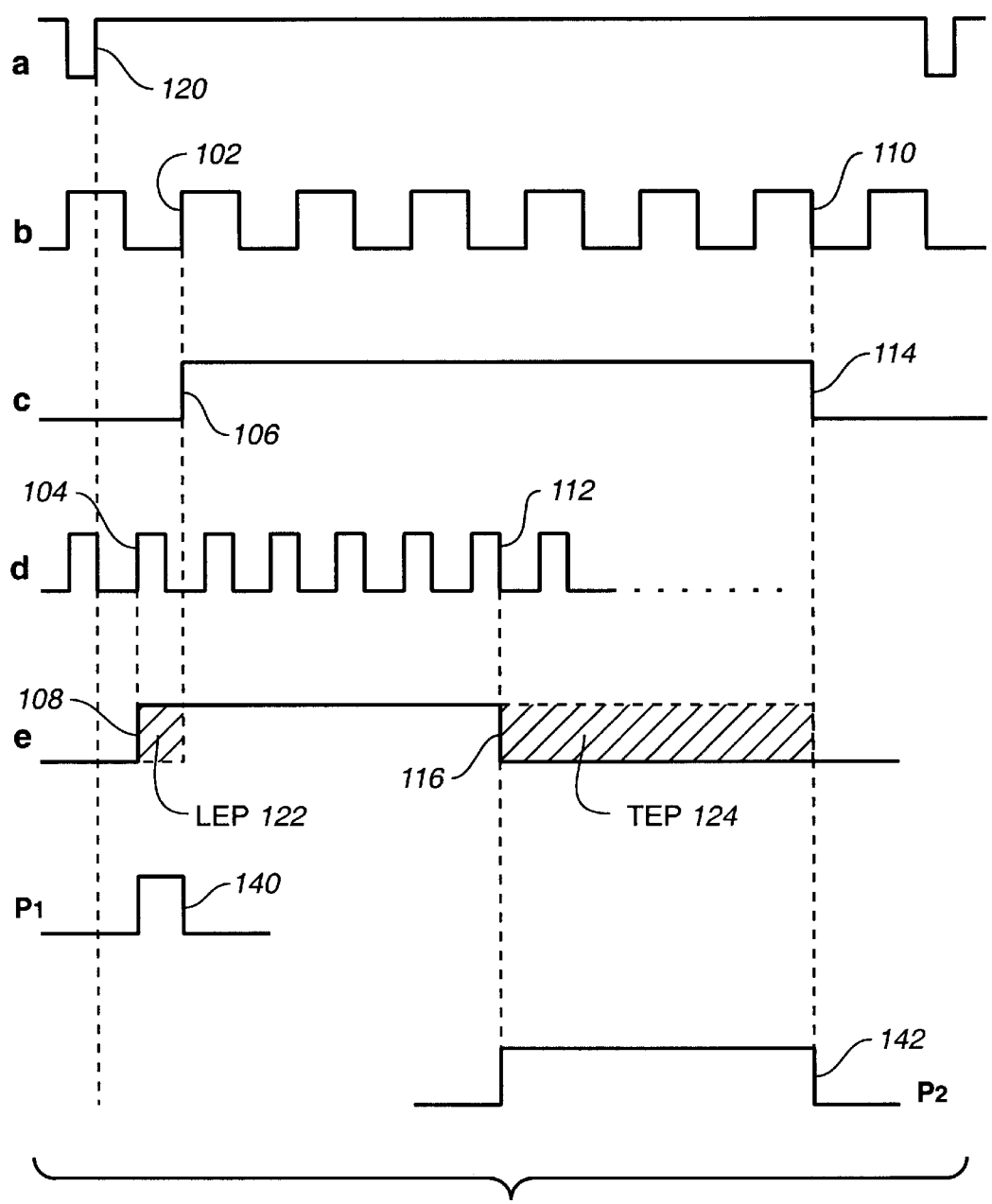
FIG._5

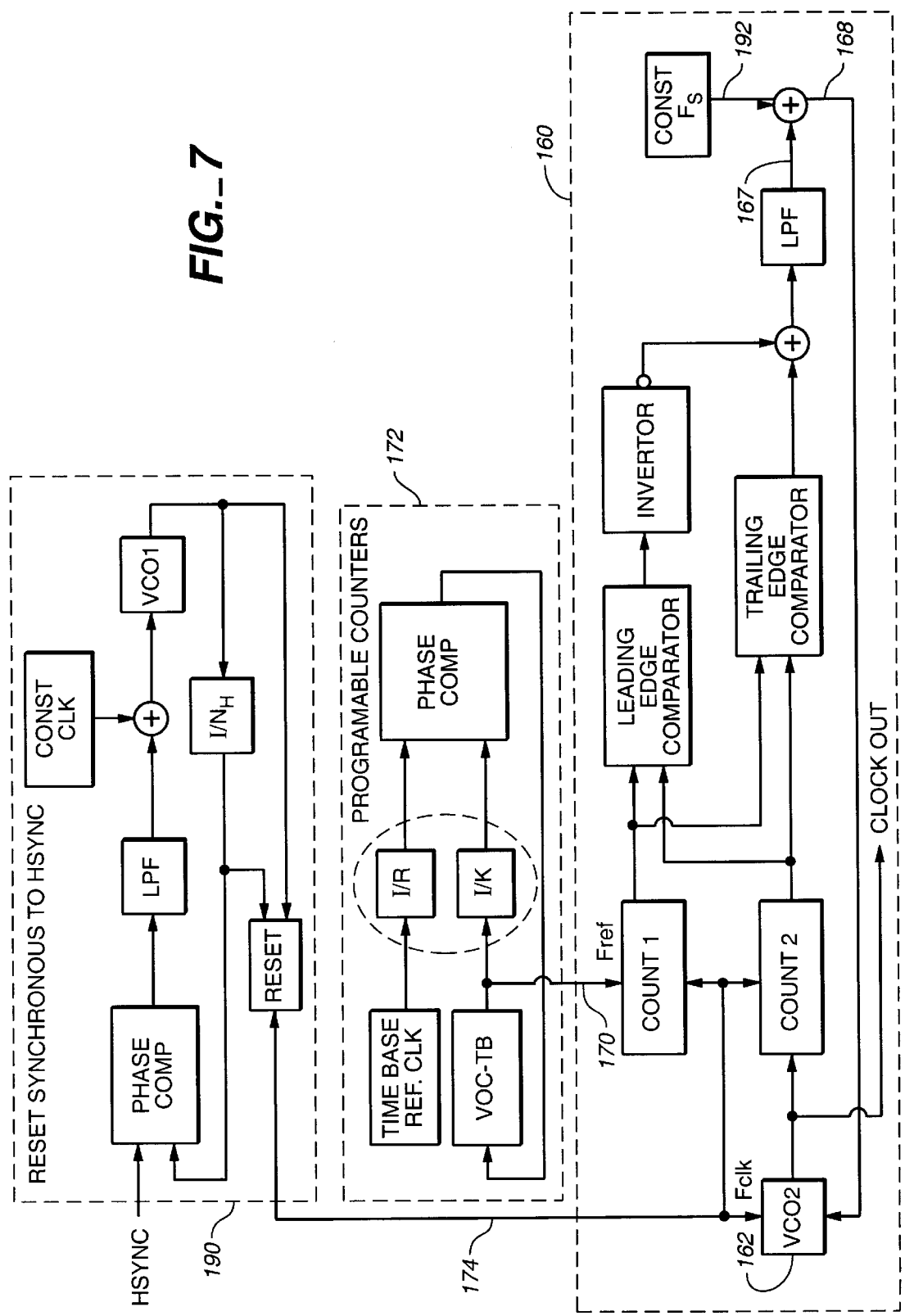
FIG._7

PHASE AND FREQUENCY LOCKED CLOCK GENERATOR

BACKGROUND OF THE INVENTION

The present invention relates to voltage-controlled oscillators, especially voltage-controlled oscillators used in a phase locked loop ("PLL") circuitry.

An example of phase locked loop circuitry is shown in FIG. 1. The phase locked loop 10 includes a voltage-controlled oscillator 12. The output of the voltage-controlled oscillator is sent to a divider 14. The divider produces one output pulse for every N input pulses. The output of the divider is compared with an input synchronizing pulse in a phase detector 16. The phase detector 16 produces a correction signal on line 18 which is sent to the low-pass filter ("LPF") 20. The filtered correction signal, such as a control voltage, is used to control the frequency of the output of the voltage-controlled oscillator ("VCO") 12. The output on line 22 of the voltage-controlled oscillator 12 will have a frequency "N" times the frequency of the sync pulses.

FIG. 2 shows another prior art phase locked loop circuit 24. The phase locked loop circuit 24 is used in systems when the frequency of the voltage-controlled oscillator is not a harmonic of the synchronizing signal (e.g. a horizontal synchronizing signal of television signal) and another frequency (e.g. a synchronizing pulses) is used for reference. For example, the output clock signal can be a dot clock for the generation of the on-screen display ("OSD") in a television application when there is no incoming video signal. In that case, a reference frequency from a crystal oscillator can be used as the system clock. Referring to FIG. 2, the output of the first voltage-controlled oscillator 26 is sent to the divide-by-N counter 28. The output of the divide-by-N counter 28 is compared in the phase detector 30 with the reference frequency provided from a crystal oscillator. The correction signal is filtered in a low-pass filter 32 and sent to both the first voltage-controlled oscillator 26 and the second voltage-controlled oscillator 34. In the phase locked loop as shown, the second voltage-controlled oscillator 34 is synchronized using the sequence of synchronizing pulses. Independently of the synchronizing pulses' stability, the second voltage-controlled oscillator output at line 36 will be in phase with the synchronizing pulses.

This approach relies on the first and second voltage-controlled oscillators having identical characteristics. Specifically, the output of the first voltage-controlled oscillator is sent to the feedback loop, but the output of the second voltage-controlled oscillator is not. In fact, both the voltage-controlled oscillators will inevitably have different parameters, especially the sensitivities to the control signal and to the noise. If this phase locked loop circuit is used in a television application, the difference in VCO parameters can cause, for example, differences in the OSD size due to differences in frequency of the second voltage-controlled oscillator output.

Another approach to solve this problem is disclosed in U.S. patent application Ser. No.: 08/951,139, filed on Oct. 15, 1997, now patent No. 6,018,273 by the same inventor of the present application. The application is hereby incorporated by reference. The phase locked loop disclosed in the application is shown in FIG. 3.

Referring to FIG. 3, the phase locked loop comprises two voltage-controlled oscillators (i.e. a first voltage-controlled oscillator, and a second voltage-controlled oscillator) and a synchronizing circuit. In the phase locked loop as shown, the synchronizing circuit turns on the second voltage-controlled oscillator after a synchronizing pulse is received. When the first voltage-controlled oscillator completes a cycle, it is turned off. Next, after one full cycle of the second voltage-controlled oscillator, the first voltage-controlled oscillator is re-started such that it is synchronized with the second voltage-controlled oscillator and thus with the synchronizing pulse. In this manner, the output of the first voltage-controlled oscillator is both synchronized with the synchronizing pulse and controlled by a feedback circuitry connected to the output of the first voltage-controlled oscillator. Since the output of the feedback circuit is used to control the voltage-controlled oscillator which produces the output of the circuit, the differing parameter characteristics of the first and second voltage-controlled oscillators is less of a problem. The timing period controlled by the second voltage-controlled oscillator is relatively short so the error caused by the parameter differences does not accumulate. Even though this method provides the desirable results of producing a clock output both running at substantially identical frequency as with the system clock and synchronizing with the synchronizing pulse, this method requires two voltage-controlled oscillators which is not preferred in some application.

Therefore, it is desired to have a phase locked loop system using a single voltage-controlled oscillator capable of generating a clock output both running at substantially identical frequency with the system clock and also synchronizing with the synchronizing pulse.

SUMMARY OF THE INVENTION

It is an object of the present invention to provide a phase locked loop circuit capable of synchronizing with a synchronizing signal.

It is another object of the present invention to provide a phase locked loop circuit for generating an output clock signal running at exactly the same frequency of a required frequency, while providing synchronizing.

The preferred embodiment of the present invention discloses a phase locked loop circuit having a voltage-controlled oscillator and a feedback circuit to control the frequency of the output clock of the voltage-controlled oscillator. In the preferred embodiment, the feedback circuit comprises two counters, a first counter and a second counter. Both of these two counters are fed with a synchronizing signal for simultaneously resetting both two counters. After the reset is released, each of the counter generates a gauge signal by counting a predetermined number of cycles of the system clock and the output clock produced by the voltage-controlled oscillator, respectively. The two gauge signals are then provided to a leading edge comparator and a trailing edge comparator. The two comparators measures the leading edge phase shift and the trailing edge phase shift between these two gauge signals. After both the leading edge and trailing edge phase shifts are determined, a combined phase shift is generated by subtracting the trailing edge phase shift by the leading edge phase shift. Finally, a control signal is generated to be fed back to the voltage-controlled oscillator to adjust its output frequency so that the combined phase shift can be eliminated. Specifically, the control signal is proportional to the frequency difference between the two gauge signals. The output clock generated by the phase locked loop according to the present invention is, therefore, both synchronized with the system clock and running at the exact frequency of the system clock.

The above and other features and aspects of the present invention will become more apparent upon reading the following detailed description in conjunction with the accompanying drawings.

BRIEF DESCRIPTION OF THE DRAWINGS

FIG. 1 is a diagram of a prior art phase locked loop circuit.

FIG. 2 is a diagram of another prior art phase locked loop circuit using two voltage-controlled oscillators.

FIG. 3 is a diagram of another phase locked loop circuit using two voltage-controlled oscillators.

FIG. 4 is a diagram of an embodiment of the phase locked loop circuit of the present invention.

FIG. 5 is a timing diagram showing the generation of two gauge signals.

FIG. 6 is a timing diagram showing the synchronizing signal and the two gauge signals C1 and C2.

FIG. 7 is a diagram of another embodiment of the phase locked loop circuit of the present invention.

DETAILED DESCRIPTION OF THE DRAWINGS

FIG. 4 shows a preferred embodiment of a phase locked loop 60 according to the present invention. The phase locked loop as shown comprises two sections: a voltage-controlled oscillator 62 for generating an output clock 66, and a feedback circuit 64 for providing a correction signal 68 to control the frequency of the output clock 64 generated by the voltage-controlled oscillator 62. In the preferred embodiment as shown, the phase locked loop 60 is provided by a system clock generator 72 with a system clock 70 running at exactly at a required frequency. In the example as shown, the frequency of this system clock 70 is N times higher than the input reference frequency (e.g. 32768 Hz in this example). The system clock generator 72 of this embodiment comprises a basic phase locked loop circuit to reduce any noise accompanying the input gauge signal. It should be noted that the system clock 70 is not synchronized with the synchronizing signal 74 provided even though the system clock 70 is running at exactly the required frequency. Thus, the phase locked loop 60 of the present invention is designed to generate the synchronized output clock 66 running at the same frequency of the system clock 70 while being synchronized with the synchronizing signal 74.

As shown in the figure, the voltage-controlled oscillator 62 is provided with the correction signal 68 to control the frequency of the output clock 66. In the embodiment as shown, the correction signal 68 is a filtered control signal provided by the feedback circuit 64. Specifically, the control signal is provided by an adder 78 by combining two compensation pulses 80,82. Specifically, the first compensation pulse 80 is an inverted value from the output of the leading edge comparator 84, whereas the second compensation pulse 82 is the output of the trailing edge comparator 86. The control signal 76 is, in fact, generated by subtracting the output of the leading edge comparator 84 from the output of the trailing edge comparator 86, thus performing comparison of the time durations of two gauge signals. In addition, in the preferred embodiment as shown, the synchronizing signal 74 is provided to the voltage-controlled oscillator 62 to reset the oscillator 62. When a synchronizing pulse is received from the synchronizing signal 74, the voltage-controlled oscillator 62 begins to oscillate so that the first voltage transition of the output clock 66 of the voltage-controlled oscillator 62 coincides with the triggering edge of the synchronizing pulse.

In the preferred embodiment as shown, the feedback circuit 64 comprises two counters (i.e. a first counter 88, and a second counter 90) and two edge comparators 84,86, an inverter 92, an adder 78 and a low pass filter 94. As shown in the figure, the system clock 70 is provided to the first counter 88, whereas the output clock 66 generated by the voltage-controlled oscillator 62 is provided to the second counter 90. In addition, both the first and second counters 88,90 are fed with the synchronizing signal 74 for simultaneously reset. It should be noted that other forms of reset signal can be used for the two counters 88,90. The synchronizing signal 74 is used in this preferred embodiment for resetting the two counters because the synchronizing signal 74 is readily available. Specifically, when the reset signal is received, both two counters 88,90 are released to begin counting the numbers of pulses received.

In this preferred embodiment, the first counter 88 generates a first gauge signal C1 96 from the system clock 70, whereas the second counter 90 generates a second gauge signal C2 98 from the output clock 66 generated by the voltage-controlled oscillator 62. In the preferred embodiment as shown, the first gauge signal C1 96 comprises a pulse having a first voltage transition (e.g. a leading edge) coincides with the first voltage transition (e.g. leading edge) of the system clock 70 after the reset signal is actuated. Furthermore, the second voltage transition (e.g. trailing edge) of the pulse coincides with the voltage transition (e.g. trailing edge) of the system clock 70 N clock cycles after the reset signal is actuated. In this embodiment, N is a predetermined positive integer.

Similarly, the second gauge signal C2 98 comprises a pulse having a first voltage transition (e.g. a leading edge) coincides with the first voltage transition (e.g. leading edge) of the output clock 66 generated by the voltage-controlled oscillator 62 after the reset signal is actuated. The second voltage transition (e.g. trailing edge) of the pulse coincides with the voltage transition (e.g. trailing edge) of the output clock 66 generated by the voltage-controlled oscillator 62 N clock cycles after the reset signal is actuated.

FIG. 5 shows the generation of the two gauge signals C1,C2 according to the present invention. For illustration purposes, all waveforms of FIG. 5 are leading edge triggered.

Referring to FIG. 5, waveform a represents the synchronizing signal 74. Waveform b represents the system clock 70, and waveform d represents the output clock 66 generated by the voltage-controlled oscillator 62 when no reset is actuated. Waveform c represents the first gauge signal C1 96 generated by the first counter 88, and waveform e represents the second gauge signal C2 98 generated by the second counter 90. In this example, N is chosen to be 6. That is, each of the two counters 88,90 generates a gauge signal for N=6 clock cycles of the corresponding clock input. Specifically, the pulse duration of the first gauge signal C1 96 represents N clock cycles of the system clock 70, and the pulse duration of the second gauge signal C2 98 represents N clock cycles of the output clock 66 generated by the voltage-controlled oscillator 62.

Comparing waveforms b and c, it can be seen that the first gauge signal C1 96 goes high (i.e. first voltage transition 106) on the first leading edge 102 of the system clock 70 after reset by a synchronizing pulse. Then the first gauge signal C1 96 remains high for N=8 cycles and falls back to low (i.e. second voltage transition 114) on the trailing edge 110 of the eighth clock cycle of the system clock 70.

Similarly, comparing waveforms d and e, it can be seen that the second gauge signal C2 98 goes high (i.e. first voltage transition 108) on the first leading edge 104 of the output clock 66 generated by the voltage-controlled oscillator 62 after reset by the synchronizing signal 74. In this case, since the voltage-controlled oscillator 62 and the counter 2 are both reset by the same synchronizing signal 74, the leading edge (i.e. first voltage transition 108) of the second gauge signal C2 98 coincides with the leading edge 120 of the synchronizing signal 74. Then, the second gauge signal C2 98 remains high for the same number of cycles (i.e. 6 cycles) and falls back to low (i.e. second voltage transition 116) on the trailing edge 112 of the eighth clock cycle of the output clock 66 generated by the voltage-controlled oscillator 62.

Since the system clock 70 and the output clock 66 generated by the voltage-controlled oscillator 62 are not synchronized, there are a leading edge phase shift LEP 122 and a trailing edge phase shift TEP 124 between waveforms c and d. According to the present invention, the leading edge phase shift LEP 122 is caused by the phase difference between the system clock 70 and output clock 66. In addition, a combined phase shift can be generated by subtracting the trailing edge phase shift TEP 124 by the leading edge phase shift LEP 122. The combined phase shift represents the difference between the time duration of the first gauge signal C1 96 and the time duration of the second gauge signal C2 98. In other words, since the frequency difference is inversely proportional to the time duration difference, the combined phase shift represents the frequency difference between the system clock 70 and the output clock 66 generated by the voltage-controlled oscillator 62.

The uses of these two gauge signals C1 96 and C2 98 can be illustrated by FIG. 6. Referring to FIG. 6, the first signal as shown is the synchronizing signal 74 provided to the phase locked loop of the present invention. The second signal is the first gauge signal C1 96. Furthermore, FIG. 6 shows three different cases of the second gauge signal C2 98: waveform 6a represents the second gauge signal C2 when C2=C1; waveform 6b represents the second gauge signal C2 98 when C2<C1; and waveform 6c represents the second gauge signal C2 98 when C2>C1.

In the first case where the pulse duration T2 of the second gauge signal C2 98 equals to the pulse duration T1 of the first gauge signal C1 96 (i.e. C2=C1), the output clock 66 generated by the voltage-controlled oscillator 62 and the system clock 70 are running at the same frequency. Thus, no correction is needed for the voltage-controlled oscillator 62. Furthermore, since the same synchronizing signal 74 is used for resetting both the voltage-controlled oscillator 62 and the second counter 90, there is no phase shift between the leading edges of the gauge signal C2 98 and the synchronizing pulse. On the other hand, since the system clock 70 is not synchronized with the synchronizing pulse, there is a phase shift (i.e. LEP) between the leading edge 132 of the first gauge signal C1 96 and the leading edge 130 of the synchronizing pulse, or the leading edge 134,136 or 138 of the second gauge signal C2 98. In the example as shown in waveform 6a, since the pulse duration T2 of the second gauge signal C2 98 equals to the pulse duration T1 of the gauge signal C1 96, the leading edge phase shift LEP 140 is negated by the trailing edge phase shift TEP 146. In addition, since these two phase shifts LEP 140, TEP 146 cancel each other, the combined phase shift is zero. Thus, no frequency adjustment is needed for the voltage-controlled oscillator 62. In this case, therefore, the output of the voltage-controlled oscillator 62 is running substantially identical to the required frequency and also synchronized with the synchronizing signal 74.

In the second case where the pulse duration T3 of the second gauge signal C2 is shorter than the pulse duration T1 of the first gauge signal C1 96 (i.e. C2<C1), the output clock 66 generated by the voltage-controlled oscillator 62 is running faster than the system clock 70. Thus, a negative correction signal is provided to the voltage-controlled oscillator 62 to slow down the oscillator 62. By adjusting the correction signal 68 provided to the voltage-controlled oscillator 62, the voltage-controlled oscillator 62 will be slowed down to match the frequency of the system clock 70.

However, it should be emphasized again that even though the output clock 66 generated by the voltage-controlled oscillator 62 is running faster than the required frequency, the leading edge 136 of the first cycle of output clock 66 generated by the voltage-controlled oscillator 62 is still synchronized with the synchronizing signal 74 because a same reset input is provided to both the voltage controlled oscillator 62 and the second counter 90. Thus, in this case, the combined phase shift can be determined by subtracting the trailing edge phase shift TEP 148 by the leading edge phase shift LEP 142. Then the negative adjustment value provided to the voltage-controlled oscillator 62 can be determined accordingly. By simply adjusting the frequency of the output clock 66, the output clock 66 signal generated by the voltage controlled oscillator 62 will be running at substantially identical to the required frequency and also synchronized with the synchronizing signal 74.

Finally, in the third case where the pulse duration T4 of C2 98 is longer than the pulse duration T1 of C1 96 (C2>C1), the output clock 66 generated by the voltage-controlled oscillator 62 is running slower than the system clock 70. Thus, a positive correction signal is provided to the voltage-controlled oscillator 62 to increase the speed of the oscillator 62. By adjusting the correction signal 68 fed to the voltage-controlled oscillator 62, the voltage-controlled oscillator 62 will be slowed down to eliminate the combined phase shift such that the frequency of the output clock 66 of the voltage-controlled oscillator 62 matches with the frequency of the system clock 70. Again, it should be emphasized that even though the voltage-controlled oscillator 62 is running at a lower frequency than the required frequency (i.e. system clock 70), the leading edge 138 of the first cycle of the voltage-controlled oscillator 62 is still synchronized with the synchronizing signal 74 because the same reset signal (i.e. synchronizing signal 74) is provided to both the voltage controlled oscillator 62 and the counter 2. Thus, in this case, the combined phase shift can also be determined by subtracting the trailing edge phase shift TEP 150 by the leading edge phase shift LEP 144. It should be noted that, in this case, the trailing phase shift LEP 144 has a negative value. Then, a positive adjustment value provided to the voltage-controlled oscillator 62 can be determined accordingly. By adjusting the frequency of output clock 66, the resulting frequency of the output clock generated by the voltage controlled oscillator 62 will be running at substantially identical to the required frequency and synchronized with the synchronizing signal 74.

Referring back to FIG. 4, therefore, the phase locked loop 60 according to the present invention further comprises the two edge comparators: the leading edge comparator 84, and the trailing edge comparator 86. As shown in the figure, each of the two comparators 84,86 is provided with both two gauge signals (i.e. the first gauge signal C1 96 and the second gauge signal C2 98). The two comparators 84,86 then determine the leading edge phase shift LEP 122 (of FIG. 5) and the trailing edge phase shift TEP 124 (of FIG. 5) between the two gauge signals 96,98. Particularly, the leading edge comparator 96 compares the leading edges of the two gauge signals C1 96 and C2 98, and generates a leading edge compensation pulse P1 140 as shown in FIG. 5. On the other hand, the trailing edge comparator 86 compares the trailing edges of the two gauge signals C1 96 and C2 98, and generates a trailing edge compensation pulse P2 142 as shown in FIG. 5. It should be noted that, in this preferred embodiment, when the pulse duration of the second gauge signal C2 98 is greater than the pulse duration of the first gauge signal C1 96, the trailing edge compensation pulse generated by the trailing edge comparator is a negative pulse.

Subsequently, the inverted value 80 of the leading edge compensation pulse and the trailing edge compensation pulse 82 is summed by the adder 78 and form a total compensation value 76. The total compensation value 76 is then fed to a low pass filter LPF2 94 to generate a filtered correction signal 68, such as a control voltage, to control the frequency of the output clock 66 generated by the voltage-controlled oscillator 62.

Therefore, in this preferred embodiment, the output clock 66 is provided by the voltage-controlled oscillator 62, and is both synchronized with the synchronizing signal 74 and running at substantially identical frequency as the system clock 70.

FIG. 7 shows another embodiment of the present invention. The phase locked loop 160 as shown is similar to the phase locked loop 60 as shown in FIG. 4. In this embodiment, the synchronizing signal 174 is fed to a signal restorer 190 to restore a clean synchronizing signal 174 from noise. Specifically, a conventional phase locked loop circuit is used as the signal restorer 190 in this preferred embodiment to generate the clean synchronizing signal 74.

Furthermore, the system clock 170 in this embodiment is provided by a programmable system clock generator 172. The programmable system clock generator 172 is similar in design with a programmable phase locked loop capable of adjusting the frequency of the system clock 170 generated by adjusting the values of R and K. Various designs of the programmable counters are known in the art, and are not within the scope of the present invention. However, by adjusting the system clock 170, the phase locked loop 160 of the preferred embodiment can be adjusted to different frequency requirements.

In addition, in this preferred embodiment, a constant frequency offset 192 is also added to the output of the filtered control signal 167 provided to the voltage-controlled oscillator 162. The constant frequency offset 192 is provided to adjust the output frequency of the voltage controlled oscillator 162 to accommodate to different frequency requirement.

It is to be understood that while the invention has been described above in conjunction with preferred specific embodiments, the description and examples are intended to illustrate and not limit the scope of the invention, which is defined by the scope of the appended claims.

What is claimed is:

1. An apparatus comprising:
   a system clock input providing a system clock;
   a synchronizing signal input providing a sequence of synchronizing pulses;
   a voltage-controlled oscillator for generating an output clock running at an output clock frequency, said voltage-controlled oscillator having a stop/start input connected to said synchronizing signal input, a correction signal input for controlling said output clock frequency; and
   a feedback circuit connected to said output clock of said voltage-controlled oscillator and said system clock signal for producing said correction signal input for said voltage-controlled oscillator,
   wherein said correction signal is generated by comparing a first pulse duration of at least one cycle of the output of the voltage-controlled oscillator with a second pulse duration of the same number of cycle of said system clock, wherein each of the synchronizing pulses resets said voltage-controlled oscillator.

2. An apparatus comprising:
   a system clock input providing a system clock;
   a synchronizing signal input providing a sequence of synchronizing pulses;
   a voltage-controlled oscillator for generating an output clock running at an output clock frequency, said voltage-controlled oscillator having a stop/start input connected to said synchronizing signal input, a correction signal input for controlling said output clock frequency; and
   a feedback circuit connected to said output clock of said voltage-controlled oscillator and said system clock signal for producing said correction signal input for said voltage-controlled oscillator,
   wherein said correction signal is generated by comparing a first pulse duration of at least one cycle of the output of the voltage-controlled oscillator with a second pulse duration of the same number of cycle of said system clock;
   a system clock counter and a main counter, said system clock counter generates a first gauge signal having a pulse having a pulse duration equals to N cycles of said system clock, and said main counter generates a second gauge signal having a pulse duration equals to N cycles of said output clock of said voltage-controlled oscillator, where N is a positive integer equal or greater than 1.

3. The apparatus of claim 2, both said system clock counter and said main counter being connected to said synchronizing signal input, wherein each of the synchronizing pulses resets said system clock counter and said main counter.

4. The apparatus of claim 3 further comprising a leading edge comparator and a trailing edge comparator, wherein said leading edge comparator generates a first correction value by comparing a leading edge phase shift between said first gauge signal and said second gauge signal, and wherein said trailing edge comparator generates a second correction value by comparing a trailing edge phase shift between said first gauge signal and said second gauge signal.

5. The apparatus of claim 4, wherein said correction signal is generated by comparing said first correction value and said second correction value.

6. The apparatus of claim 5, wherein said correction signal is generated by passing a pulse representing the difference between said first correction value and said second correction value through a low pass filter.

7. An apparatus comprising:
   a system clock input providing a system clock, wherein said system clock is programmable so that the frequency of said system clock is adjustable to any predetermined frequency;
   a synchronizing signal input providing a sequence of synchronizing pulses;
   a voltage-controlled oscillator for generating an output clock running at an output clock frequency, said voltage-controlled oscillator having a stop/start input connected to said synchronizing signal input, a correction signal input for controlling said output clock frequency; and
   a feedback circuit connected to said output clock of said voltage-controlled oscillator and said system clock signal for producing said correction signal input for said voltage-controlled oscillator,
   wherein said correction signal is generated by comparing a first pulse duration of at least one cycle of the output of the voltage-controlled oscillator with a second pulse duration of the same number of cycle of said system clock.

8. An apparatus comprising:

a system clock input providing a system clock, a synchronizing signal input providing a sequence of synchronizing pulses, wherein said sequence of synchronizing pulses is generated by a clock restorer to reduce noises accompanying with said sequence of synchronizing pulses;

a voltage-controlled oscillator for generating an output clock running at an output clock frequency, said voltage-controlled oscillator having a stop/start input connected to said synchronizing signal input, a correction signal input for controlling said output clock frequency; and a feedback circuit connected to said output clock of said voltage-controlled oscillator and said system clock signal for producing said correction signal input for said voltage-controlled oscillator, wherein said correction signal is generated by comparing a first pulse duration of at least one cycle of the output of the voltage-controlled oscillator with a second pulse duration of the same number of cycle of said system clock.

9. A method comprising:

providing a synchronizing signal having a sequence of synchronizing pulses;

generating an output clock by a voltage-controlled oscillator, wherein said output clock is synchronized with each synchronizing pulse;

generating a system clock running at a required frequency;

generating a first gauge signal after a reset signal is received, wherein said first gauge signal has a first voltage transition coinciding with a first voltage transition of said system clock following said reset signal, and wherein said first gauge signal has a second voltage transition after a predetermined number of clock cycles of said system clock after said reset is received;

generating a second gauge signal after said reset signal is received, wherein said second gauge signal has a first voltage transition coinciding with said first voltage transition of the output clock signal following said reset signal, and wherein said second gauge signal has a second voltage transition after said predetermined number of clock cycles of said output clock signal after said reset is received;

determining a first phase shift between the first voltage transition of said first gauge signal and the first voltage transition of said second gauge signal;

determining a second phase shift between the second voltage transition of said first gauge signal and the first voltage transition of said second gauge signal;

combining said first phase shift and second phase shift to form a combined phase shift; and adjusting said voltage-controlled oscillator to reduce said combined phase shift.

10. The method according to claim 9, wherein said first voltage transition of said first gauge signal and said first voltage transition of second gauge signal are leading edges, and wherein said second voltage transition of said first gauge signal and said second voltage transition of second gauge signal are trailing edges.

11. The method according to claim 9, wherein said first voltage transition of said first gauge signal and said first voltage transition of second gauge signal are trailing edges, and wherein said second voltage transition of said first gauge signal and said second voltage transition of second gauge signal are leading edges.

12. The method according to claim 9, wherein said reset signal is connected to said synchronizing signal.

13. The method according to claim 9, said combining step comprising:

subtracting said second phase shift by said first phase shift to form said combined phase shift.

14. The method according to claim 9, said adjusting step comprising:

passing said combined phase shift through a low pass filter; and using the filtered combined phase shift to control said voltage-controlled oscillator.

15. A voltage-controlled oscillator for use in a phase locked loop, comprising:

an output clock running at an output frequency;

a reset input to restart the oscillation of the voltage-controlled oscillator, said reset input connected to a synchronizing signal such that said output clock is synchronized with the synchronizing signal when said reset input is activated; and a control signal for controlling said output frequency of said output clock so that said output frequency of said output clock equals to the frequency of a system clock, wherein said control signal is generated by comparing the phase shift of at least one cycle of said output clock and said at least one cycle of said system clock, wherein said phase shift comprises a leading edge phase shift and a trailing edge phase shift.

16. The voltage controlled oscillator according to claim 15, said leading edge phase shift is generated by a leading edge comparator, and said trailing edge phase shift is generated by a trailing edge comparator.

17. The voltage controlled oscillator according to claim 16, said leading edge comparator and said trailing edge comparator are connected to a first counter and a second counter, said first counter is provided with said system clock, and said second counter is provided with said output clock of said voltage-controlled oscillator, wherein said first counter generates a first gauge signal after a reset signal is received, said first gauge signal having a first voltage transition coinciding with a first voltage transition of said system clock following said reset signal, and said first gauge signal having a second voltage transition after a predetermined number of clock cycles of said system clock after said reset is received, and wherein said second counter generates a second gauge signal after said reset signal is received, said second gauge signal having a first voltage transition coinciding with said first voltage transition of the output clock signal following said reset signal, and said second gauge signal having a second voltage transition after said predetermined number of clock cycles of said output clock signal after said reset is received.

* * * * *